(12) United States Patent
Los (10) Patent No.: US 9,360,938 B2
(45) Date of Patent: Jun. 7, 2016

(54) INPUT DEVICE WITH TACTILE FEEDBACK

(75) Inventor: Oleg Los, Buffalo Grove, IL (US)

(73) Assignee: BlackBerry Limited, Waterloo, Ontario (CA)

(*) Notice: Subject to any disclaimer, the term of this patent is extended or adjusted under 35 U.S.C. 154(b) by 429 days.

(21) Appl. No.: 13/094,149

(22) Filed: Apr. 26, 2011

(65) Prior Publication Data

US 2012/0274576 A1 Nov. 1, 2012

(51) Int. Cl.
| | |
|---|---|
| *G06F 3/01* | (2006.01) |
| *G06F 3/023* | (2006.01) |
| *G06F 3/0488* | (2013.01) |
| *G06F 3/041* | (2006.01) |
| *G06F 1/16* | (2006.01) |
| *B81C 1/00* | (2006.01) |
| *H01L 41/09* | (2006.01) |

(52) U.S. Cl.
CPC ............. *G06F 3/016* (2013.01); *B81C 1/0038* (2013.01); *B81C 1/00373* (2013.01); *G06F 1/1662* (2013.01); *G06F 3/0238* (2013.01); *G06F 3/041* (2013.01); *G06F 3/04886* (2013.01); *H01L 41/09* (2013.01)

(58) Field of Classification Search
CPC ... B81C 1/00373; B81C 1/0038; G06F 3/016; G06F 3/041; H01L 41/09
USPC .................. 345/156, 169, 173–178
See application file for complete search history.

(56) References Cited

U.S. PATENT DOCUMENTS

| | | | |
|---|---|---|---|
| 6,242,850 B1 * | 6/2001 | Slutskiy et al. ............... 310/328 |
| 6,982,432 B2 * | 1/2006 | Umemoto et al. ............. 257/12 |
| 7,288,178 B2 * | 10/2007 | Cohen et al. ................... 205/118 |
| 2004/0059245 A1 | 3/2004 | Watanabe et al. |
| 2004/0129919 A1 * | 7/2004 | Horikawa et al. ...... 252/62.9 PZ |
| 2005/0264528 A1 | 12/2005 | Burry |
| 2008/0143693 A1 | 6/2008 | Schena |
| 2009/0167704 A1 | 7/2009 | Terlizzi et al. |
| 2009/0225046 A1 | 9/2009 | Kim et al. |
| 2009/0322496 A1 * | 12/2009 | da Costa .................... 340/407.2 |
| 2010/0079410 A1 | 4/2010 | Minton |
| 2011/0148777 A1 * | 6/2011 | Meng ............................. 345/173 |
| 2012/0068957 A1 * | 3/2012 | Puskarich et al. ............. 345/174 |

FOREIGN PATENT DOCUMENTS

EP 1681618 A1 7/2006

OTHER PUBLICATIONS

Akdogan et al., "Piezoelectric Composites for Sensor and Actuator Applications", May 2005, IEEE Transactions on Ultrasonics, Ferroelectrics, and Frequency Control, vol. 52 No. 5, p. 746-775.*
Extended European Search Report for European Application No. 11163780.7, dated Sep. 14, 2011, 6 pages.
Canadian Intellectual Property Office, Examiner's Report issued in connection with Canadian Application No. 2,773,836, dated May 29, 2014, 4 pages.

* cited by examiner

*Primary Examiner* — David Tung
(74) *Attorney, Agent, or Firm* — Fish & Richardson P.C.

(57) ABSTRACT

An input device includes an electrical isolator disposed on a base, the electrical isolator comprising at least a first element extending away from the base. A first actuator is disposed on the base and on a first side of the first element and is configured to provide first tactile feedback. A second actuator is disposed on the base and on a second side of the first element and is configured to provide second tactile feedback. A touch sensor is disposed with the first actuator and the second actuator and is arranged to provide touch data such that input is provided based on the touch data.

18 Claims, 5 Drawing Sheets

FIG. 17

INPUT DEVICE WITH TACTILE FEEDBACK

FIELD OF TECHNOLOGY

The present disclosure relates to electronic devices, including but not limited to, portable electronic devices having touch-sensitive displays and their control.

BACKGROUND

Electronic devices, including portable electronic devices, have gained widespread use and may provide a variety of functions including, for example, telephonic, electronic messaging and other personal information manager (PIM) application functions. Portable electronic devices include, for example, several types of mobile stations such as simple cellular telephones, smart telephones, wireless personal digital assistants (PDAs), and laptop computers with wireless 802.11 or Bluetooth capabilities.

Portable electronic devices such as PDAs or smart telephones are generally intended for handheld use and ease of portability. Smaller devices are generally desirable for portability. A touch-sensitive display, also known as a touch-screen display, is particularly useful on handheld devices, which are small and have limited space for user input and output. The information displayed on the touch-sensitive displays may be modified depending on the functions and operations being performed. With continued demand for decreased size of portable electronic devices, touch-sensitive displays continue to decrease in size.

Improvements in devices with touch-sensitive displays are desirable.

DETAILED DESCRIPTION

The following describes an apparatus for and method of providing input to an electronic device via an input device. The input device comprises an electrical isolator with one or more elements that separate piezo devices. The input device also comprises a touch sensor that provides touch data such that input to the electronic device is provided based on the touch data. A display element may optionally be provided. The input device may be a low-profile device that provides tactile feedback via the piezo devices and may be associated with multiple different inputs, which may be varied through a display element.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein. All electrical lines, such as control lines, signal lines, power, ground, and so forth, are not shown in the drawings for the sake of simplicity.

The disclosure generally relates to an electronic device, which is a portable electronic device in the embodiments described herein. Examples of portable electronic devices include mobile, or handheld, wireless communication devices such as pagers, cellular phones, cellular smartphones, wireless organizers, personal digital assistants, wirelessly enabled notebook computers, tablet computers, and so forth. The portable electronic device may also be a portable electronic device without wireless communication capabilities, such as a handheld electronic game device, digital photograph album, digital camera, or other device.

Figure 1:
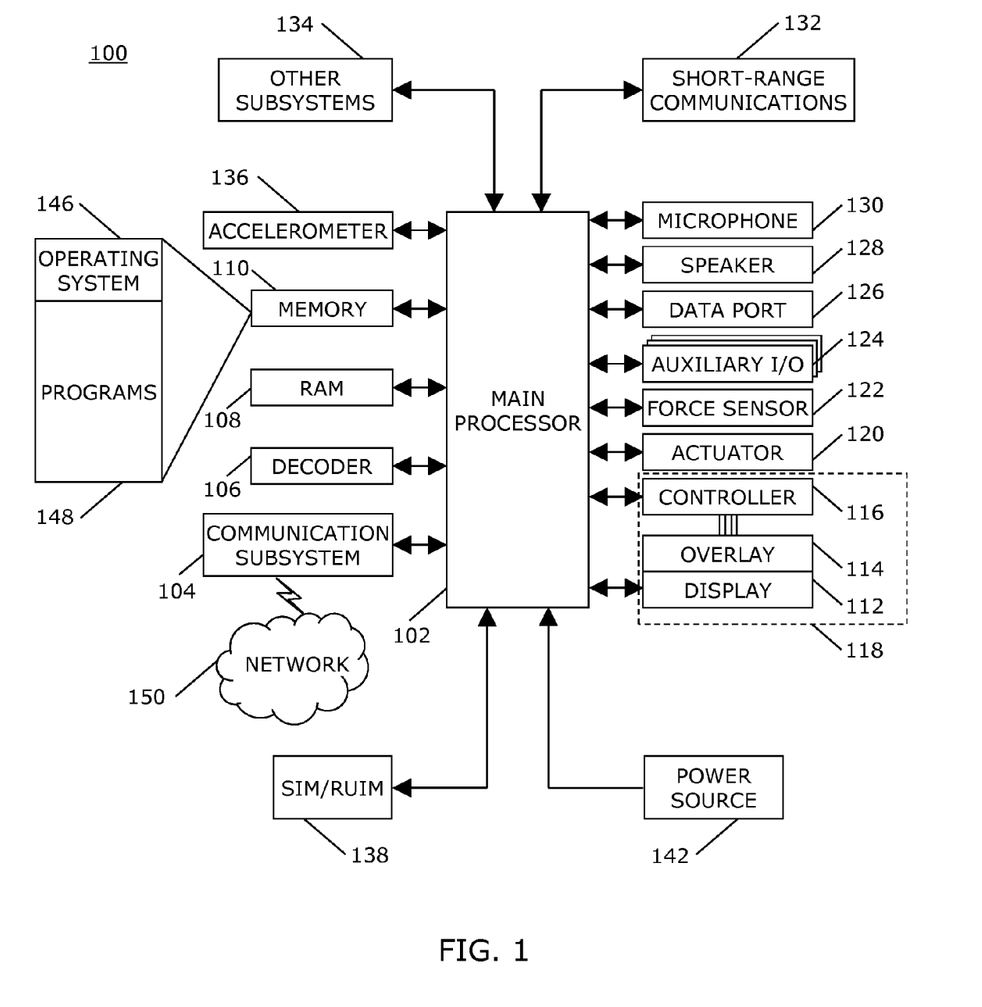
FIG. 1 is a block diagram of a portable electronic device in accordance with the disclosure.

A block diagram of an example of a portable electronic device 100 is shown in FIG. 1. The portable electronic device 100 includes multiple components, such as a processor 102 that controls the overall operation of the portable electronic device 100. Communication functions, including data and voice communications, are performed through a communication subsystem 104. Data received by the portable electronic device 100 is decompressed and decrypted by a decoder 106. The communication subsystem 104 receives messages from and sends messages to a wireless network 150. The wireless network 150 may be any type of wireless network, including, but not limited to, data wireless networks, voice wireless networks, and networks that support both voice and data communications. A power source 142, such as one or more rechargeable batteries or a port to an external power supply, powers the portable electronic device 100.

The processor 102 interacts with other components, such as Random Access Memory (RAM) 108, memory 110, a display 112 with a touch-sensitive overlay 114 operably coupled to an electronic controller 116 that together comprise a touch-sensitive display 118, one or more actuators 120, one or more force sensors 122, an auxiliary input/output (I/O) subsystem 124, a data port 126, a speaker 128, a microphone 130, short-range communications 132, and other device subsystems 134. User-interaction with a graphical user interface is performed through the touch-sensitive overlay 114. The processor 102 interacts with the touch-sensitive overlay 114 via the electronic controller 116. Information, such as text, characters, symbols, images, icons, and other items that may be displayed or rendered on a portable electronic device, is displayed on the touch-sensitive display 118 via the processor 102. The processor 102 may interact with an accelerometer 136 that may be utilized to detect direction of gravitational forces or gravity-induced reaction forces.

To identify a subscriber for network access, the portable electronic device 100 uses a Subscriber Identity Module or a Removable User Identity Module (SIM/RUIM) card 138 for communication with a network, such as the wireless network 150. Alternatively, user identification information may be programmed into memory 110.

The portable electronic device 100 includes an operating system 146 and software programs or components 148 that are executed by the processor 102 and are typically stored in a persistent, updatable store such as the memory 110. Additional applications or programs may be loaded onto the portable electronic device 100 through the wireless network 150, the auxiliary I/O subsystem 124, the data port 126, the short-range communications subsystem 132, or any other suitable subsystem 134.

A received signal such as a text message, an e-mail message, or web page download is processed by the communication subsystem 104 and input to the processor 102. The processor 102 processes the received signal for output to the display 112 and/or to the auxiliary I/O subsystem 124. A subscriber may generate data items, for example e-mail messages, which may be transmitted over the wireless network 150 through the communication subsystem 104. For voice communications, the overall operation of the portable electronic device 100 is similar. The speaker 128 outputs audible information converted from electrical signals, and the microphone 130 converts audible information into electrical signals for processing.

The touch-sensitive display 118 may be any suitable touch-sensitive display, such as a capacitive, resistive, infrared, surface acoustic wave (SAW) touch-sensitive display, strain gauge, optical imaging, dispersive signal technology, acoustic pulse recognition, and so forth, as known in the art. A capacitive touch-sensitive display includes a capacitive touch-sensitive overlay 114. The overlay 114 may be an assembly of multiple layers in a stack including, for example, a substrate, a ground shield layer, a barrier layer, one or more capacitive touch sensor electrodes/layers separated by a substrate or other barrier, and a cover. The capacitive touch sensor layers may be any suitable material, such as patterned indium tin oxide (ITO). The electrodes/layers may alternatively comprise copper or other suitable conductor when the touch sensor is not disposed above a display.

One or more touches, also known as touch contacts or touch events, may be detected by the touch-sensitive display 118. The processor 102 may determine attributes of the touch, including a location of a touch. Touch location data may include an area of contact or a single point of contact, such as a point at or near a center of the area of contact. The location of a detected touch may include x and y components, e.g., horizontal and vertical components, respectively, with respect to one's view of the touch-sensitive display 118. For example, the x location component may be determined by a signal generated from one touch sensor, and the y location component may be determined by a signal generated from another touch sensor. A signal is provided to the controller 116 in response to detection of a touch. A touch may be detected from any suitable contact member, such as a finger, thumb, appendage, or other objects, for example, a stylus, pen, or other pointer, depending on the nature of the touch-sensitive display 118. Multiple simultaneous touches may be detected.

The actuator(s) 120 may be depressed or activated by applying sufficient force to overcome the actuation force of the actuator 120. The actuator(s) 120 may provide input to the processor 102 when actuated. Actuation of the actuator(s) 120 may result in provision of tactile feedback. In one embodiment when the actuator(s) 120 is disposed below the touch-sensitive display 118 and force is applied, the touch-sensitive display 118 is depressible, pivotable, and/or movable. Such a force may actuate the actuator(s) 120. The touch-sensitive display 118 may, for example, float with respect to the housing of the portable electronic device, i.e., the touch-sensitive display 118 may not be fastened to the housing. A mechanical dome switch actuator may be utilized. In this example, tactile feedback is provided when the dome collapses due to imparted force and when the dome returns to the rest position after release of the switch. Alternatively, the actuator 120 may comprise one or more piezoelectric (piezo) devices that provide tactile feedback for the touch-sensitive display 118.

Optional force sensors 122 may be disposed in conjunction with the input device 200 to determine or react to forces applied to the input device 200. The force sensor 122 may be disposed in line with a piezo actuator 120. The force sensors 122 may be force-sensitive resistors, strain gauges, piezoelectric or piezoresistive devices, pressure sensors, quantum tunneling composites, force-sensitive switches, or other suitable devices. Force as utilized throughout the specification, including the claims, refers to force measurements, estimates, and/or calculations, such as pressure, deformation, stress, strain, force density, force-area relationships, thrust, torque, and other effects that include force or related quantities.

Figures 2, 3, 4:
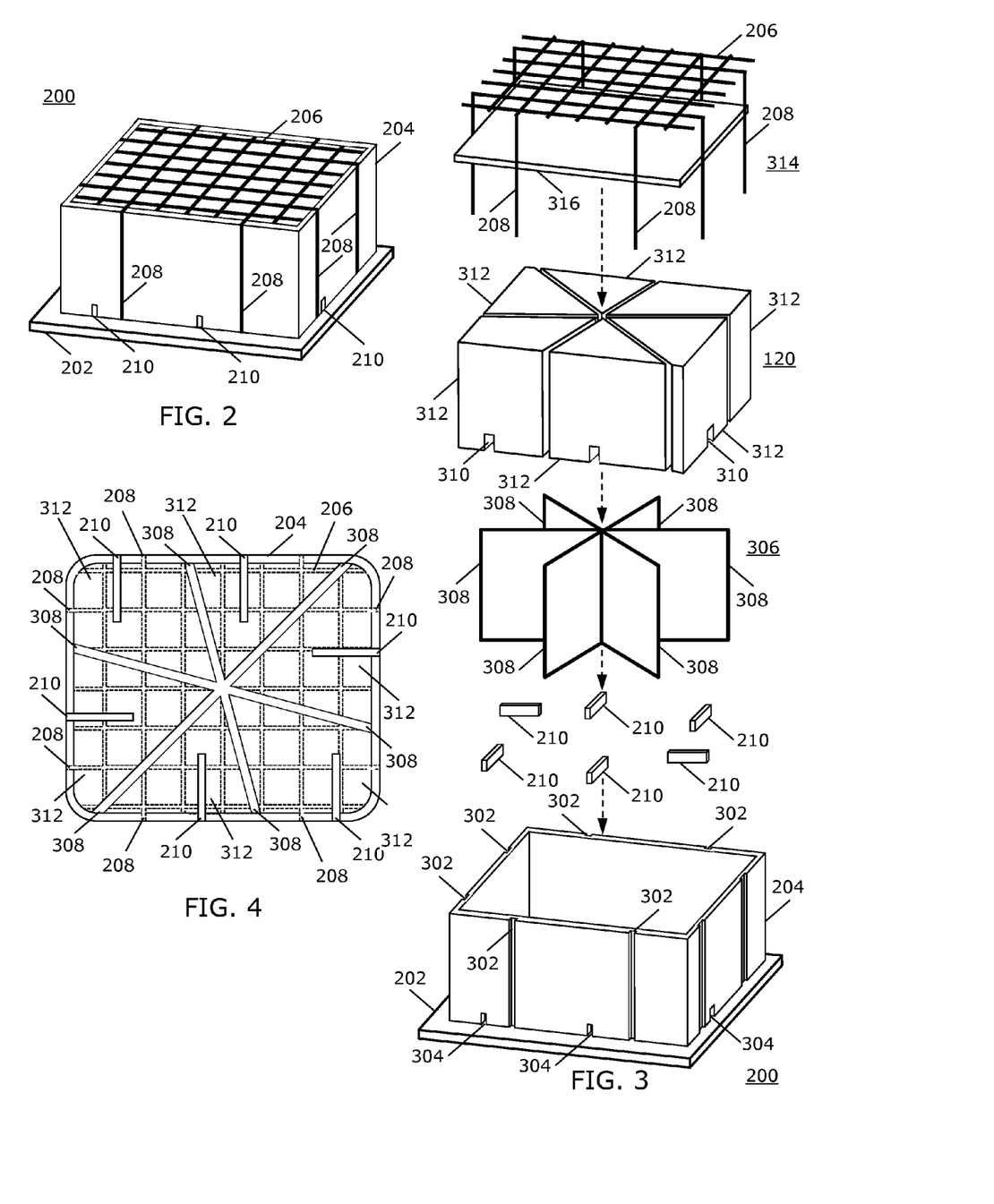
FIG. 2 is a perspective view of an input device in accordance with the disclosure.
FIG. 3 is an exploded view of an input device in accordance with the disclosure.
FIG. 4 is a bottom view of an input device in accordance with the disclosure.

A perspective view of an input device 200 is shown in FIG. 2. The input device 200 may be utilized to input information to the processor 102, in a similar way that a physical key or touch-sensitive display inputs information. The input device comprises a substrate or base 202, such as a printed circuit board or other suitable material on which one or more input devices 200 are disposed. The input devices 200 may optionally be formed directly on the base 202. An outer shell, casing, or housing 204 may be disposed on the outer perimeter of the input device 202, for example, to protect the input device and/or provide support. The housing 204 may comprise a ceramic material that may be sprayed or deposited on the input device 200. Alternatively, the housing 204 may formed and disposed on the base 202, and the remainder of the input device formed or assembled thereafter.

At least one touch sensor 206, for example, comprising a conductive mesh of electrodes, provides touch data to the controller 116 through one or more conductors 208. As shown, the conductors 208 are disposed within the walls of the housing 204, although they may be disposed inside or outside the housing 204, as long as the conductors 208 are electrically isolated from other parts of the input device 200, such as the piezo devices 312. The conductors 208 extend from the touch sensor 206 to the base 202 or any other suitable connection and through point. Actuator conductors 210 transfer electrical signals between actuators 120, such as the piezo devices 312 (see FIG. 3) disposed within the input device 200, and the processor 102 or a controller/driver that controls the actuators 120. In this example, the input device 200 has six piezo devices 312 and corresponding actuator conductors 210. The input device 200 provides touch data and data from the piezo devices 312 to the controller 116 and/or the processor 102. The touch sensor 206 provides touch data such that electrical input to the electronic device 100 is provided based on the touch data. Input results from user interaction with the electronic device 100, for example, when the user operates the electronic device 100 to make selections such as text input, to engage in a phone call, to access a website, and so forth. The selections are often made in association with information displayed on the display 112.

An exploded view of an input device is shown in FIG. 3. The housing 204 is shown on the base 202 with spaces or openings 302 for the conductors 208 and holes or openings 304 for the actuator conductors 210. An electrical isolator 306 is disposed on the base 202. The electrical isolator 306 is comprised of one or more elements 308 that extend away from the base. The elements 308 are advantageously disposed substantially perpendicular to the base. Two or more piezo devices 312 are disposed between and/or on the side of the elements 308 of the electrical isolator 306. In the example of FIG. 3, six piezo devices 312 are disposed between six elements 308, one piezo device 312 disposed between the sides of two consecutive elements 308. The electrical isolator 306 comprises a non-conductive material, for example, a non-conductive fired ceramic such as silicon dioxide, also known as silica, and electrically isolates the piezo devices 312 from each other. A cavity 310 is shown in each piezo device 312 to accommodate the actuator conductor 210. The cavity 310 may be formed when the piezo device 312 is formed or deposited on the base 202. Alternatively, the actuator conductors 210 may be formed or attached to the lower (with respect to the orientation of the drawing) surface of the piezo device 312.

The piezo devices 312 sprayed, vapor deposited, or printed, such as screen printed, onto the base 202 between the elements 308. Optionally, the piezo devices may be individually-formed devices disposed between the elements 308 of the isolator 206. The piezo devices 312 may be single-layer devices or multiple-layer devices. Multiple-layer devices may be comprised of multiple sprayed, vapor deposited, or printed layers, individually constructed in stack of layers, or a stack of individually-formed devices placed on top of each other between the isolator 306 elements 308. The piezoelectric material may be lead zirconate titanate or any other suitable material. The piezoelectric material may have any suitable shape and geometrical features, for example a non-constant thickness, chosen to meet desired specifications. The piezo devices 312 may optionally be fastened to the base 202, for example, by adhesive, lamination, laser welding, and/or by other suitable fastening method or device. The piezo devices 312 are shown disposed in the same plane in FIG. 3.

The piezo devices 312 provide tactile feedback. Because piezo devices 312 are electrically isolated, the piezo devices 312 may be separately controlled and each may provide different tactile feedback. Thus, any one or more of the piezo devices 312 may be activated at a time. When activated, the piezo devices 312 may provide differing feedback. For example, the tactile feedback may only be provided by the piezo device 312 associated with a location of the touch. Each different piezo device 312 of a single input device 312 may provide different tactile feedback. For example, the tactile feedback may be directional. Directional tactile feedback may be provided along a line in a direction or may tactilely travel in a direction. Directional tactile feedback may be provided, for example, at the outer perimeter of the input device 200 near the housing 204. One or more of the piezo devices 312 may be activated in sequence, e.g., left-to-right, up and down, in a circle, and so forth. The tactile feedback may be tailored to a specific application. For example, a game may provide tactile feedback that directs a user where to go, where danger is coming from, how to change direction, and so forth. In another example, the tactile feedback may be randomly applied at different piezo devices for user to find in a hide-and-seek manner.

The piezo actuators 120 are electrically coupled, via the actuator conductors 210, to a piezo driver that communicates with a controller/driver (not shown). The controller/driver is also in communication with the main processor of the portable electronic device 100 and may exchange signals with the main processor 102. The piezo actuators 120 and any optional force sensors 122 are operatively coupled to the main processor 102 via the controller/driver. The controller/driver controls the piezo driver that controls the current/voltage to the piezoelectric devices of the actuator 120, and thus the controller/driver controls the force applied by the piezo actuators 120 as tactile feedback. The piezoelectric actuators 120 may be controlled individually via a separate control line between each actuator 120 and the controller/driver. Different signals may be sent to each different actuator 120. Alternatively, the piezoelectric actuators 120 may be controlled substantially equally and concurrently, for example, by the same signal that may be provided through a common control line that extends to each actuator 120.

The tactile feeling of switches, actuators, keys, other physical objects, and so forth may be simulated, or a non-simulated tactile feedback may be provided by controlling the piezoelectric actuators 120. For example, when a force applied on the input device 200 exceeds a depression threshold, the voltage/charge at the piezo actuators 120 is modified such that the piezo actuator 120 imparts a force as tactile feedback, which force may, for example, simulate depression of a dome switch. When the force applied falls below a release threshold, the voltage/charge at the piezo actuators 120 is modified such that the piezo actuator 120 imparts a force or discontinues imparting a force as tactile feedback, which may, for example, simulate release of a dome switch.

An insulator 316 is disposed as a layer on the first piezo devices 312, between the piezo devices 312 and the touch sensor 206. The insulator 316 electrically insulates the piezo devices 312 from the touch sensor 206 and may optionally provide mechanical structure for the input device 200. The insulator 316 may comprise, for example, a non-conductive fired ceramic such as silicon dioxide, also known as silica, which may an individual element placed on the piezo devices 312 or may be deposited or printed with the piezo devices 312. The touch sensor 206 is disposed on the insulator 316.

A bottom view of the input device 200 is shown in FIG. 4. As shown in this example, the elements 308 of the electrical isolator 306 extend between the walls of the housing 204 and extend from the bottom to the top of the walls of the housing 204. The piezo devices 312 are shown between the elements 308 on their sides. The actuator conductor 210 is shown reaching from a middle area of each piezo device 312 through the housing 204. Each of the conductors 208 is shown disposed in a space or opening 302 extending along the wall of the housing 204.

Figure 5:
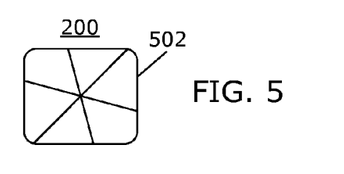
FIG. 5, FIG. 6, and FIG. 7 are top views of various input devices in accordance with the disclosure.
Figure 6:
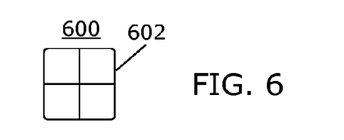
Figure 7:
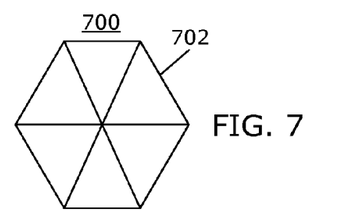
Figures 12, 13:
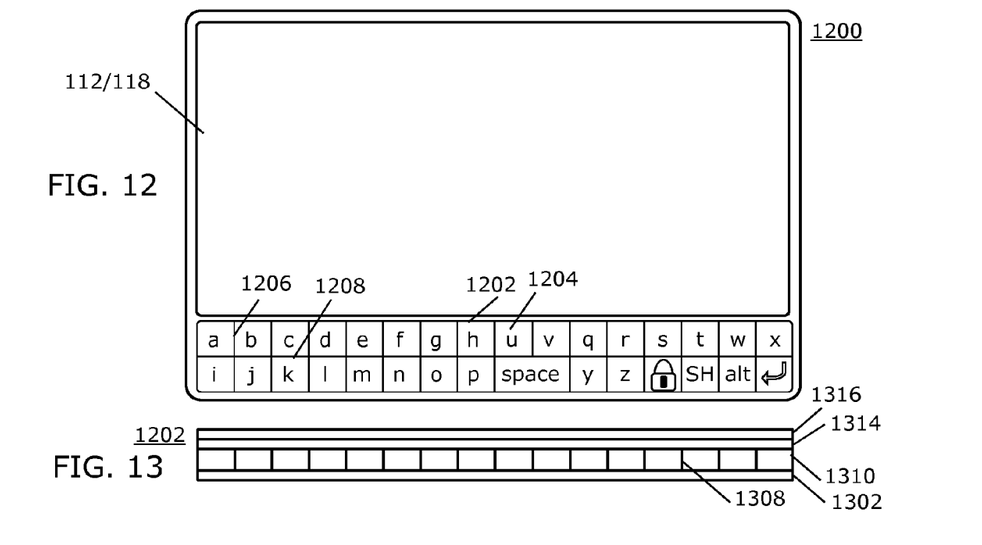
FIG. 13 is a cross-sectional view of an input device with a display element in accordance with the disclosure.

Top views of various input devices are shown in FIG. 5, FIG. 6, and FIG. 7. Any number of piezo devices, separated and electrically isolated from each other by an appropriate number of elements in the electrical isolator, may be provided. The electrical isolator may have one or more elements. The electrical isolator may divide the input device into equally-sized and similarly-shaped sections or segments in which the piezo devices are disposed. One piezo device is advantageously disposed in each section such that tactile feedback may be provided separately for each section. The sections need not be equally-sized or similarly-shaped. FIG. 5 illustrates an input device 200 having six sections 502, as shown in the embodiment of FIG. 2 through FIG. 4 and FIG. 8. FIG. 6 illustrates an input device 600 having four sections 602, which are substantially square and equally-sized, as shown in the embodiment of FIG. 9. FIG. 7 illustrates an input device 700 having six equally-sized and similarly-shaped sections 702. Any appropriate number of sections may be utilized. The example of FIG. 12 illustrates an input device having 31 sections, 30 of which are equally-sized and similarly-shaped and another having another size and shape. Other combinations, shapes, and sizes may be successfully implemented. The piezo devices are formed similarly in each of the embodiments, as described above.

Figure 8:
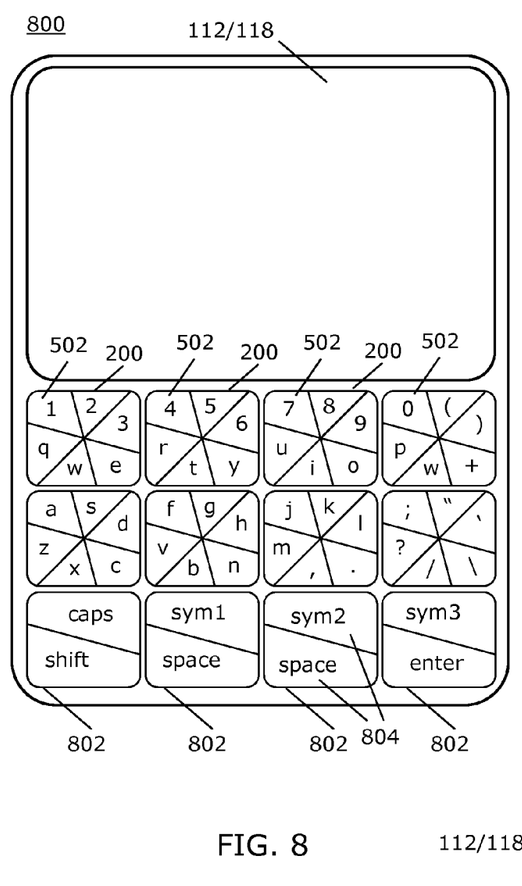
FIG. 8, FIG. 9, and FIG. 12 are front views of input devices incorporated into a portable electronic device in accordance with the disclosure.
Figure 9:
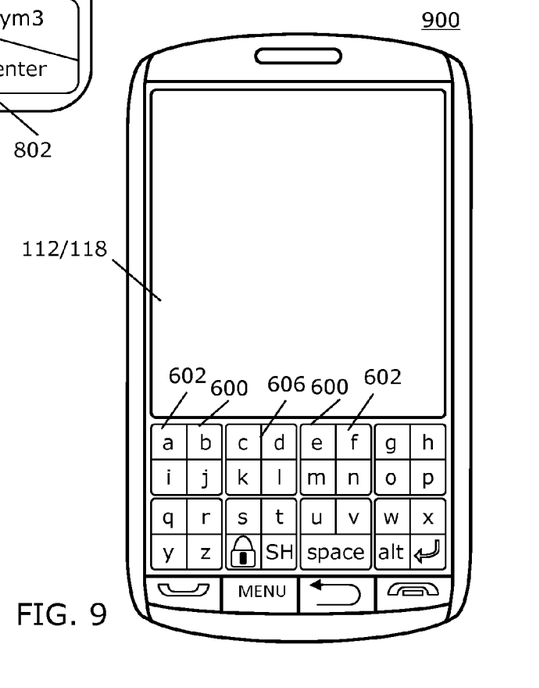

Front views of input devices incorporated into a portable electronic device are shown in FIG. 8 and FIG. 9. A portable electronic device 800, comprising similar components as the portable electronic device 100, includes 12 input devices 200. Each of the input devices 200 in the top two rows has six sections 502, and each of the input devices 802 in the bottom row has two sections 804, formed by an electrical isolator with one element. The sections 502, 804 are shown with characters or control functions to provide associated input to the portable electronic device 800.

A portable electronic device 900, comprising similar components as the portable electronic device 100, includes 8 input devices 600. Seven of the input devices 600 have four sections 602 formed by an electrical isolator 606 having four elements. One of the input devices 600, with the "space" label, has three sections 602, formed by an electrical isolator with three element that divide the input device 602 into two smaller sections on top and one larger section on the bottom. The sections 602 are shown with characters or control functions to provide associated input to the portable electronic device 900.

Figure 10:
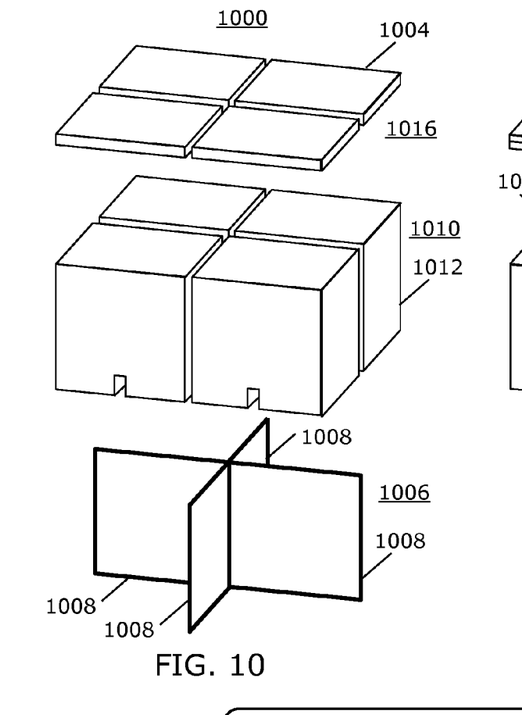
FIG. 10 and FIG. 11 are exploded views of an input device with a display element in accordance with the disclosure.
Figure 11:
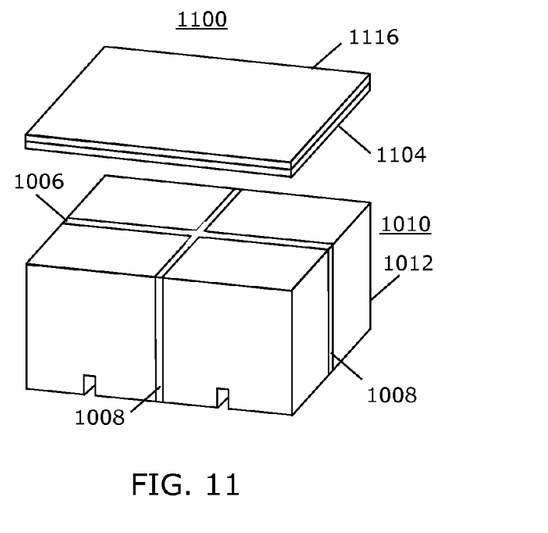

Exploded views of parts of an input device 1000, 1100 with a display element are shown in FIG. 10 and FIG. 11. Text representing the characters or control functions may be printed, etched, or otherwise marked on the input devices 200, 802. Optionally, one or more display elements may be integrated with one or more input devices. Different information may be displayed on the display elements, such that each of the sections may be associated with different information, such as different characters or control functions. Each section of the input device may be associated with numerous different pieces of information, which may be provided via the processor 102 for different applications or situations. FIG. 10 and FIG. 11 illustrate an input device 1000, 1100 similar to the input device 600 in FIG. 6 having four sections 602. An electrical isolator 1006 has four elements 1008 that separate the four piezo devices 1012 disposed in a single plane, collectively denoted 1010.

FIG. 10 illustrates an example of a display element 1004 utilized for each different section or piezo device 1012, i.e., one display element for each piezo device 1012. The display elements 1004 are collectively denoted 1016. The touch sensor 206 is disposed on top of the display elements 1016, such as described above.

FIG. 11 illustrates an example of a display element 1116 utilized for all of the piezo devices 1012, i.e., one display element on or above all the piezo devices 1012. The touch sensor 206 is disposed on top of the display element 1116, such as described above. The electrical isolator 1006 is shown disposed with the piezo devices 1012 in this embodiment.

The display elements 1016, 1116 may be adhesively attached to the piezo devices 1012 or to the housing 204. An adhesive layer 1104 may be disposed between the display elements 1016, 1116 and the piezo devices 1012. The display elements 1016, 1116 may be bonded with an anisotropic conductive film (ACF), wherein the adhesive layer 1104 comprises the ACF bond once compressed. Appropriate electrical connections (not shown) for the display elements 1016, 1116 may be disposed outside, within, or inside the housing 204. The display element may comprise electrical connections disposed on a substrate with at least one display device. Electrical connections for the display elements 1016, 1116 may alternatively be provided via one or more ACF bonds.

Although the examples of FIG. 10 and FIG. 11 as described above have display elements 1016, 1116 disposed between the touch sensor 206 and the piezo devices 1012, the display elements 1016, 1116 may alternatively be disposed above the touch sensor 206, i.e., the touch sensor 206 is between the display element 1016, 1116 and the piezo devices 1012. The display elements may comprise, for example, liquid crystal displays (LCDs), light emitting diodes (LEDs), organic light-emitting diodes (OLEDs), active matrix organic light-emitting diodes (AMOLEDs), and so forth.

A portable electronic device 1200, comprising similar components as the portable electronic device 100, includes one input device 1202 having 31 sections 1204, 30 of which are equally-sized and similarly-shaped and another having another size and shape. The electrical isolator 1206 has numerous elements 1208 that separate the various sections 1204. The sections 1204 are shown with characters or control functions to provide associated input to the portable electronic device 1200. A single display element is disposed above the input device 1202.

A cross-sectional view of the input device 1202 with a display element 1312 is shown in FIG. 13. In this example, a base 1302 supports a plurality of piezo devices 1310. A single display element 1314 is shown disposed above the piezo devices 1310, and a touch sensor 1316 is disposed above the display 1314. Optionally, the touch sensor 1316 may be disposed above the piezo devices 1310, and the single display element 1314 may be disposed above the touch sensor 1316. The electrical isolator 1308 separates the piezo devices 1310.

Figure 14:
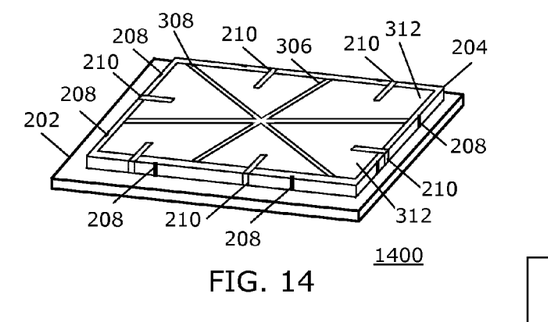
FIG. 14 and FIG. 15 are perspective views of various layers of an input device in accordance with the disclosure.
Figure 15:
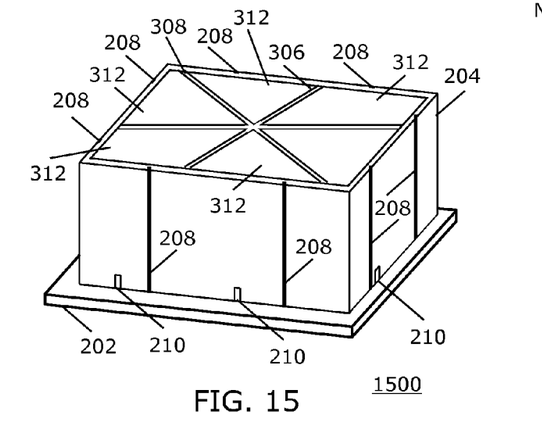

Perspective views of various layers of an input device are shown in FIG. 14 and FIG. 15. One method of producing the input device 200, 600, 700, 1202, or part of the input device, is by a high volume print forming process such as provided by EoPlex Technologies. Such a process utilizes a layered printing process, with masks or screens for each layer, to deposit ceramic, metal, and polymer. Many input devices 200, 600, 700, 1202 may be simultaneously produced on a single substrate.

A first mask or screen is utilized to print the lowest unique layer on the substrate or base 202, such as shown in FIG. 14. This lowest layer comprises the conductors 208 and actuator conductors 210 that are metal, piezo devices 312 that are a ceramic composite, an isolator 306 comprising ceramic elements 308, and a ceramic housing 204. The first mask or screen may be utilized numerous times until the lowest layer reaches the desired thickness.

A second mask or screen is utilized to print the next or middle layer on the lowest unique layer as shown in FIG. 15. This middle layer comprises the conductors 208 that are metal, piezo devices 312 that are a ceramic composite, an isolator 306 comprising ceramic elements 308, and a ceramic housing 204. The second mask or screen may be utilized numerous times until the middle layer reaches the desired thickness. As shown, the middle layer is much thicker than the lowest layer, although the middle layer need not be relatively thick as shown.

A third mask or screen is utilized to print the insulator 316 as a ceramic on the middle layer. Additional masks or screens are utilized to print one or more electrodes that are part of a touch sensor 206 on the insulator 316. The layers are sintered or heated to finish the input device 200, 600, 700, 1202. A coating or other material may cover the input device 200, 600, 700, 1202, for example, to provide protection, to provide a surface to display information, and so forth.

An optional display element may be disposed on the between the insulator 316 and the touch sensor 206 or on top of the touch sensor 206, depending on the nature of the touch sensor and the nature of the display element. Optionally, the display element and touch sensor 206 may be separately produced devices or assemblies that are bonded to the masked input device 200, 600, 700, 1202 comprising the lowest, middle, and insulator layers.

Figure 16:
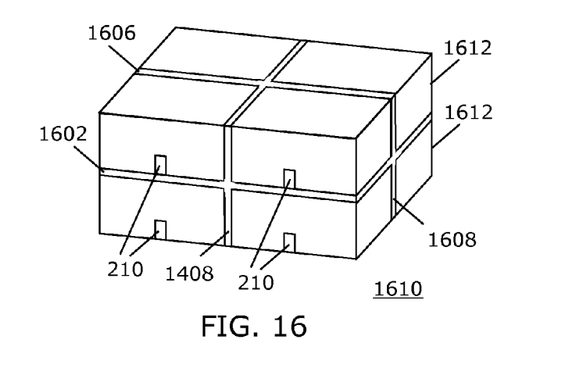
FIG. 16 is a perspective view of separated layers of piezo devices of an input device in accordance with the disclosure.

A perspective view of separated layers of piezo devices of an input device is shown in FIG. 16. The layers of the piezo devices 1612 may be separated by one or more insulators 1602, for example, in the form of layers, to amplify the tactile feedback provided by the piezo devices 1612. The insulator is an electrical insulator, such as non-conductive material, for example, a non-conductive fired ceramic such as silicon dioxide, also known as silica. Separate control lines may be provided for separated section of each piezo device 1612 or a common control line may be provided for the separated layers of the piezo devices 1612.

Figure 17:
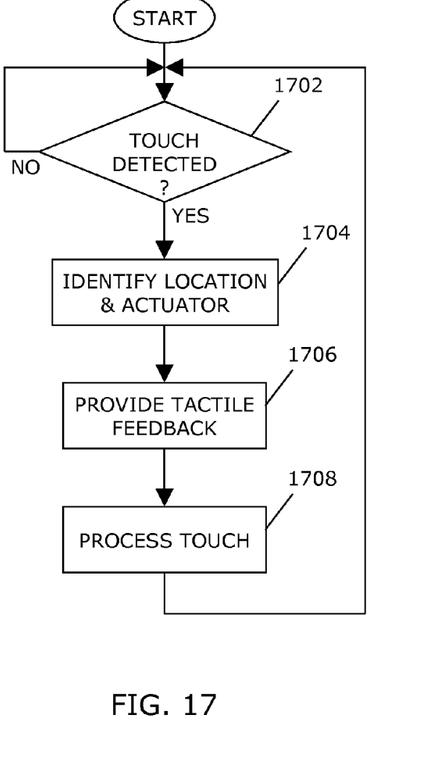
FIG. 17 is a flowchart illustrating a method of providing tactile feedback in accordance with the disclosure.

A flowchart illustrating a method of providing tactile feedback is shown in FIG. 17. The method may be carried out by software executed, for example, by the processor 102. Coding of software for carrying out such a method is within the scope of a person of ordinary skill in the art given the present description. The method may contain additional or fewer processes than shown and/or described, and may be performed in a different order. Computer-readable code executable by at least one processor of the portable electronic device to perform the method may be stored in a computer-readable medium.

When a touch is detected 1702, the location of the touch and an associated actuator are identified 1704. The location of the touch is obtained from associated touch data from the touch sensor. An actuator associated with location of the touch is identified. For example, each input device 200, 600, 700, 1202 may have a map that associates each touch location with one of the sections 502, 602, 702, 1204 of an input device. Because each section 502, 602, 702, 1204 is associated a piezo device 312, 1012, 1310, each location is associated with one actuator 120 in the form of a piezo device 312, 1012, 1310. Tactile feedback is provided 1706 at the touch location by the identified actuator by a signal that controls the feedback provided by the actuator, e.g., by a piezo controller/driver such as described above. The identified touch location is processed 1708. For example, when the touch location is associated with a character, the character is entered, e.g., when the touch location is associated with the section 502 identified as "1" in FIG. 8, a "1" is entered in a text message. When the touch location is associated with a control function, the control is activated, e.g., when the touch location is associated with the section 804 identified as "sym2" in FIG. 8, a process associating the input devices 500 with a second set of symbols is engaged.

Although the input devices are shown relatively tall compared to their width, the input device may be a low-profile device when formed with printing methods, such as 0.1 to 10 mm tall, depending on the number and thickness of the layers in the printing method. For example, one layer may be 25 microns thick. The upper surface of the input devices 200, 600, 700, 800, 1000, 1100, 1202 may be relatively flat, angled or beveled, curved, or may comprise other surface conditions. The input devices 200, 600, 700, 800, 1000, 1100, 1202 may alternatively be disposed below a part of the display 112 or touch-sensitive display 118 of the electronic device 100. When disposed below a touch-sensitive display, the touch sensor 206, 1314 may be eliminated from the input device.

An input device includes an electrical isolator disposed on a base, the electrical isolator comprising at least a first element extending away from the base. A first actuator is disposed on the base and on a first side of the first element and is configured to provide first tactile feedback. A second actuator is disposed on the base and on a second side of the first element and is configured to provide second tactile feedback. A touch sensor is disposed with the first actuator and the second actuator and is arranged to provide touch data such that input is provided based on the touch data.

A method comprises detecting a first touch at a first location on a touch-sensitive input device resulting in first touch data, providing first tactile feedback at the first location by a first actuator associated with the first location, detecting a second touch at a second location on the touch-sensitive input device resulting in second touch data, and providing second tactile feedback at the second location by a second actuator associated with the second location.

An input device comprises a touch sensor and one or more actuators, such as piezo devices. The input device may be a low-profile device that provides individualized tactile feedback for each section of the input device. An optional display element may be provided to associate different characters or control functions with each section. The input device provides the advantages of a touchscreen display with the tactile feedback that may be associated with a location, may be directional, and/or may be tailored to a touch location as desired. When a screening process is utilized, many devices may be produced at a given time, with the ability to control each one's design. Higher accuracy, reduced costs, and increased manufacturing quality result.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. An electronic device comprising:
   an input device comprising:
      a base;
      an electrical isolator disposed on the base and comprising at least a first element extending away from the base;
      a first actuator disposed on the base and on a first side of the first element and configured to provide first tactile feedback;
      a second actuator disposed on the base and on a second side of the first element and configured to provide second tactile feedback;
      touch sensors disposed with the first actuator and the second actuator arranged to provide touch data for identifying a location of a touch, such that input is provided based on the touch data, and having touch sensor electrodes extend within touch sensor electrode openings along external surfaces of an outer shell, wherein the touch sensor electrodes extend from the base to a top of the first actuator and the second actuator;
      the outer shell comprising an isolator and surrounds the first actuator and the second actuator, the outer shell having an opening direct adjacent to the base for a plurality of conductors and openings for the touch sensor electrodes;
   a processor coupled to the first actuator, the second actuator, and to the touch sensors to control the first actuator and the second actuator in response to detecting the touch;
   wherein in response to detecting the touch, the processor is configured to:
      identify the location of the touch utilizing the touch data from the touch sensors;

based on the touch data from the touch sensors, identify an associated one of the first actuator and the second actuator for actuation based on the touch data from the touch sensors;

after identifying the location of the touch and identifying the associated one of the first actuator and the second actuator, begin actuating the identified one of the first actuator and the second actuator to begin providing the first tactile feedback when the location of the touch is associated with the first actuator, such that the processor identifies the location of the touch and the first actuator prior to the start of actuation of the first actuator, and to begin providing the second tactile feedback when the location of the touch is associated with the second actuator, such that the processor identifies the location of the touch and the second actuator prior to the start of actuation of the second actuator;

wherein one layer of the input device comprises at least a part of the electrical isolator, at least a part of the first actuator, and at least a part of the second actuator, and at least a part of the first actuator and at least a part of the second actuator are formed by repeatedly printing with a first mask.

2. The electronic device of claim 1, further comprising at least one display element disposed in association with the touch sensors.

3. The electronic device of claim 2, wherein the display element is anisotropic conductive film bonded.

4. The electronic device of claim 1, wherein one display element is utilized for the first actuator and the second actuator.

5. The electronic device of claim 1, wherein a first display element is disposed above the first actuator, and a second display element is disposed above the second actuator.

6. The electronic device of claim 1, wherein the electrical isolator comprises a plurality of elements, and a plurality of actuators are disposed such that one actuator is disposed between two of the plurality of elements.

7. The electronic device of claim 1, wherein at least one of the first actuator and the second actuator comprises at least two layers separated by one or more insulators.

8. The electronic device of claim 1, wherein the first actuator and the second actuator provide directional tactile feedback.

9. The electronic device of claim 1, wherein the base is an integrated circuit board.

10. An electronic device comprising:
a touch-sensitive input device comprising:
a base;
an electrical isolator disposed on the base and comprising a plurality of elements extending away from the base;
a plurality of actuators configured to provide tactile feedback and distributed between the plurality of elements such that each of the plurality of actuators is electrically isolated from the other actuators;
touch sensors disposed above the plurality of actuators, configured to provide touch data for identifying a location of a touch, and having touch sensor electrodes extend within touch sensor electrode openings along external surfaces of an outer shell, wherein the touch sensor electrodes extend from the base to a top of the plurality of actuators;
the outer shell comprising an isolator and surrounds the plurality of actuators, the outer shell having an opening direct adjacent to the base for a plurality of conductors and openings for the touch sensor electrodes;

wherein the plurality of actuators are formed by repeatedly printing with a first mask and a cavity is formed in each of the plurality of actuators;
the plurality of conductors, wherein one of the plurality of conductors is disposed in each cavity of the plurality of actuators, wherein the plurality of conductors receive signals that control the plurality of actuators, such that each of the plurality of actuators is separately controlled;
a processor coupled to each of the plurality of actuators via the plurality of conductors, and to the touch sensors to control the plurality of actuators in response to detecting the touch;
wherein in response to detecting the touch, the processor is configured to:
identify the location of the touch utilizing the touch data from the touch sensors;
based on the touch data from the touch sensors, identify an associated one of the plurality of actuators;
after identifying the location of the touch and identifying the associated one of the plurality of actuators, begin actuating the identified one of the plurality of actuators to begin providing tactile feedback at the location of the touch by the identified one of the plurality of actuators associated with the location of the touch, such that the processor identifies the location of the touch and the associated one of the plurality of actuators prior to the start of actuation of the associated one of the plurality of actuators.

11. The electronic device of claim 10, further comprising at least one display element disposed on or above the sensors.

12. The electronic device of claim 10, wherein each of the actuators is a ceramic composite piezoelectric device.

13. The electronic device of claim 10, further comprising at least one display element comprising:
a substrate;
a plurality of electrical connections disposed on the substrate;
at least one display device.

14. An electronic device comprising:
a touch-sensitive input device comprising:
a base;
a ceramic electrical isolator disposed on the base and comprising a plurality of elements extending away from the base;
a first layer formed on the base by printing with a first mask, wherein the first layer comprises:
a plurality of ceramic composite actuators configured to provide tactile feedback and distributed between the plurality of elements such that each of the plurality of ceramic composite actuators is electrically isolated from each other;
a plurality of metal conductors, wherein one of the plurality of metal conductors is coupled to each of the plurality of ceramic composite actuators, wherein the plurality of metal conductors receive signals that control the plurality of ceramic composite actuators, such that each of the plurality of ceramic composite actuators is separately controlled;
touch sensors disposed above the first layer, configured to provide touch data for determining a location of a touch, and having touch sensor electrodes extend within touch sensor electrode openings along external surfaces of an outer shell, wherein the touch sensor electrodes extend from the base to a top of the first actuator and the second actuator;

the outer shell comprising an isolator and surrounds the first actuator and the second actuator, the outer shell having an opening direct adjacent to the base for the plurality of conductors and openings for the touch sensor electrodes;

a processor coupled to the plurality of ceramic composite actuators via the metal conductors, and to the touch sensors to control the ceramic composite actuators in response to detecting the touch;

wherein in response to detecting the touch, the processor is configured to:

identify the location of the touch utilizing the touch data from the touch sensors;

based on the touch data from the touch sensors, identify an associated one of the plurality of ceramic composite actuators for actuation;

after identifying the location of the touch and identifying the associated one of the plurality of ceramic composite actuators, begin actuating the identified one of the plurality of ceramic composite actuators to begin providing tactile feedback at the location of the touch by the identified one of the plurality of ceramic composite actuators at the location of the touch, such that the processor identifies the location of the touch and the associated one of the plurality of actuators prior to the start of actuation of the associated one of the plurality of actuators.

15. The electronic device of claim 14, wherein the first layer is formed by repeatedly printing with the first mask.

16. The electronic device of claim 14, further comprising at least one display element disposed above the first layer.

17. The electronic device of claim 14, wherein the ceramic electrical isolator and the plurality of ceramic composite actuators are further formed in a second layer that is disposed on the first layer and formed by printing with a second mask.

18. The electronic device of claim 14, wherein the first layer is sintered or heated.

* * * * *